United States Patent
Imada et al.

(10) Patent No.: US 11,254,778 B2
(45) Date of Patent: Feb. 22, 2022

(54) NOVOLAK RESINS AND RESIST MATERIALS

(71) Applicant: DIC Corporation, Tokyo (JP)

(72) Inventors: Tomoyuki Imada, Ichihara (JP); Yusuke Sato, Ichihara (JP)

(73) Assignee: DIC Corporation, Tokyo (JP)

( * ) Notice: Subject to any disclaimer, the term of this patent is extended or adjusted under 35 U.S.C. 154(b) by 179 days.

(21) Appl. No.: 16/080,837

(22) PCT Filed: Mar. 23, 2017

(86) PCT No.: PCT/JP2017/011647
§ 371 (c)(1),
(2) Date: Jan. 25, 2019

(87) PCT Pub. No.: WO2017/179385
PCT Pub. Date: Oct. 19, 2017

(65) Prior Publication Data
US 2019/0169348 A1 Jun. 6, 2019

(30) Foreign Application Priority Data
Apr. 13, 2016 (JP) .............................. JP2016-080299

(51) Int. Cl.
*G03F 7/039* (2006.01)
*C08G 8/20* (2006.01)
*G03F 7/023* (2006.01)
*G03F 7/20* (2006.01)

(52) U.S. Cl.
CPC .............. *C08G 8/20* (2013.01); *G03F 7/023* (2013.01); *G03F 7/0236* (2013.01); *G03F 7/0392* (2013.01); *G03F 7/20* (2013.01)

(58) Field of Classification Search
CPC .... G03F 7/0236; G03F 7/0233; G03F 7/0392; G03F 7/039
See application file for complete search history.

(56) References Cited

U.S. PATENT DOCUMENTS

| | | | | |
|---|---|---|---|---|
| 10,047,186 B2* | 8/2018 | Imada | ..................... | C08L 61/12 |
| 10,414,850 B2* | 9/2019 | Imada | ................... | G03F 7/0236 |
| 2008/0097032 A1* | 4/2008 | Ito | ........................ | C09D 125/18 |
| | | | | 525/185 |
| 2011/0237698 A1 | 9/2011 | Park et al. | | |
| 2013/0244174 A1* | 9/2013 | Imada | .................... | G03F 7/0236 |
| | | | | 430/270.1 |
| 2014/0023969 A1* | 1/2014 | Imada | .................. | C09D 161/06 |
| | | | | 430/270.1 |
| 2015/0184018 A1 | 7/2015 | Endo et al. | | |
| 2017/0205711 A1 | 7/2017 | Fujitani et al. | | |
| 2018/0327533 A1 | 11/2018 | Imada et al. | | |

FOREIGN PATENT DOCUMENTS

| | | |
|---|---|---|
| CN | 108290991 A | 7/2018 |
| EP | 2368925 A1 | 9/2011 |
| JP | 02-055359 A | 2/1990 |
| TW | 201420667 A | 6/2014 |
| WO | 2016/013598 A1 | 1/2016 |

OTHER PUBLICATIONS

International Search Report dated Jun. 20, 2017, issued for PCT/JP2017/011647.
Office Action dated Jul. 8, 2020, issued for Chinese Patent Application No. 201780023399.7.
Office Action dated Aug. 17, 2020, issued for the Taiwanese Patent Application No. 10-6108710.

* cited by examiner

*Primary Examiner* — Daborah Chacko-Davis
(74) *Attorney, Agent, or Firm* — Locke Lord LLP

(57) ABSTRACT

The invention provides a novolak resin having excellent properties such as heat resistance, alkali developability, photosensitivity and resolution, a photosensitive composition including the novolak resin, a curable composition including the novolak resin, a cured product thereof, and a resist material which uses the photosensitive composition or the curable composition. The novolak resin is one obtained from a compound (A) having a tris(hydroxyaryl)methine group and an aldehyde compound (B) as essential reaction ingredients. The photosensitive composition includes the novolak resin. The curable composition includes the novolak resin, and the cured product is one obtained from such a composition. The resist material uses the photosensitive composition or the curable composition.

20 Claims, 1 Drawing Sheet

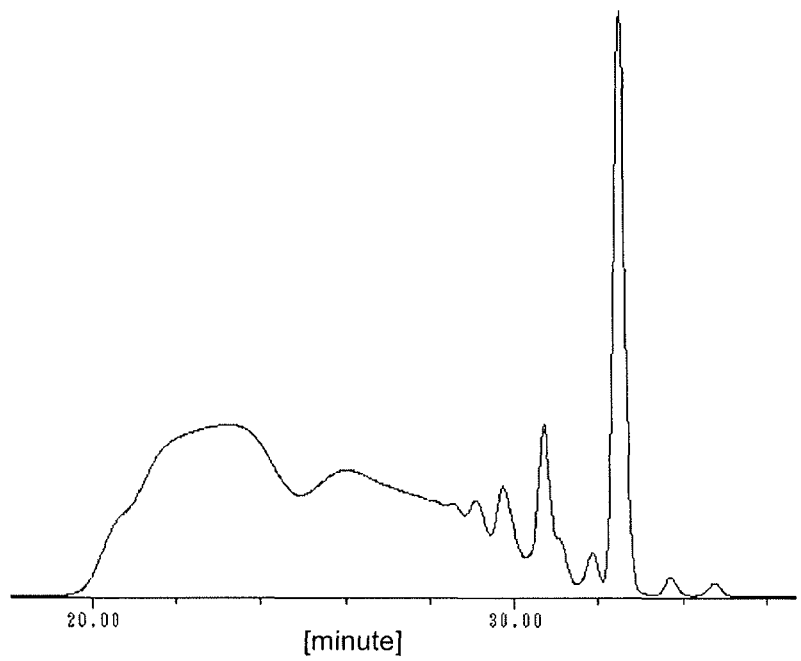

NOVOLAK RESINS AND RESIST MATERIALS

TECHNICAL FIELD

The present invention relates to novolak resins having excellent properties such as heat resistance, alkali developability, photosensitivity and resolution, and to photosensitive compositions, curable compositions and resist materials containing the resins.

BACKGROUND ART

To take advantage of excellent characteristics of phenol resins such as heat resistance, the resins are used as such or as curable compositions containing other components such as epoxy resins in various fields including photoresist materials, electronic insulating materials such as semiconductor sealing materials and printed circuit boards, adhesives, paints and molding materials.

In the field of photoresists, a wide variety of resist pattern forming methods specialized in accordance with use applications and functions have been developed one after another. This fact has involved the sophistication and diversification of performances required for resist-forming resin materials. For example, high developability is a normal performance required to form fine patterns in highly integrated semiconductors with high accuracy and production efficiency. Some other performances that are demanded are flexibility and cracking resistance where the materials are cured into thick films, and dry etching resistance and heat resistance when the materials are used as lower resist films. Further, heat resistance and toughness such as the ability to follow the substrate are demanded when the materials are used as permanent resist films.

Phenol resins which are most widely used in the photoresist application are of cresol novolak type. However, this type of resins cannot meet the sophisticated and diversified performances required in the current market, and are also unsatisfactory in terms of heat resistance and developability which are the basic performances (see PTL 1).

CITATION LIST

Patent Literature

PTL 1: Japanese Unexamined Patent Application Publication No. 2-55359

SUMMARY OF INVENTION

Technical Problem

An object of the present invention is therefore to provide a novolak resin having excellent properties such as heat resistance, alkali developability, photosensitivity and resolution, and a photosensitive composition, a curable composition and a resist material containing such a resin.

Solution to Problem

The present inventors carried out extensive studies directed to achieving the above object. As a result, the present inventors have found that a novolak resin which is obtained from a compound having a tris(hydroxyaryl)methine group as a reaction ingredient attains excellent properties such as heat resistance, alkali developability, photosensitivity and resolution, thus completing the present invention.

That is, the present invention pertains to a novolak resin which is obtained from a compound (A) having a tris(hydroxyaryl)methine group and an aldehyde compound (B) as essential reaction ingredients.

The present invention further pertains to a photosensitive composition comprising the novolak resin and a photosensitizer.

The present invention further pertains to a resist material comprising the photosensitive composition.

The present invention further pertains to a curable composition comprising the novolak resin and a curing agent.

The present invention further pertains to a cured product of the curable composition.

The present invention further pertains to a resist material comprising the curable composition.

Advantageous Effects of Invention

The novolak resins provided by the present invention attain excellent properties such as heat resistance, alkali developability, photosensitivity and resolution. The photosensitive compositions, the curable compositions and the resist materials of the invention include such a resin.

BRIEF DESCRIPTION OF DRAWING

FIG. 1 is a GPC chart of a novolak resin (1) obtained in Production Example 1.

DESCRIPTION OF EMBODIMENTS

The present invention will be described in detail hereinbelow.

A novolak resin of the present invention is one obtained from a compound (A) having a tris(hydroxyaryl)methine group and an aldehyde compound (B) as essential reaction ingredients.

The tris(hydroxyaryl)methine group which resides in the compound (A) having a tris(hydroxyaryl)methine group is a structural moiety in which a methyl group is substituted with hydroxyaryl groups in place of the three hydrogen atoms. Examples of the hydroxyaryl groups include hydroxyphenyl group, hydroxynaphthyl group, hydroxyanthryl group, and structural moieties resulting from the substitution of the above groups, on their aromatic nuclei, with one or more substituents selected from aliphatic hydrocarbon groups, alkoxy groups, aryl groups, aralkyl groups, halogen atoms and other functional groups. For the reason that the novolak resin that is obtained shows excellent alkali developability and resolution when used in resist applications, the hydroxyaryl group is preferably a hydroxyphenyl group or a structural moiety resulting from the substitution of a hydroxyphenyl group, on its aromatic nucleus, with one or more of the above substituents. More specifically, the tris(hydroxyaryl)methine group is preferably a structural moiety represented by the following structural formula (1):

[Chem. 1]

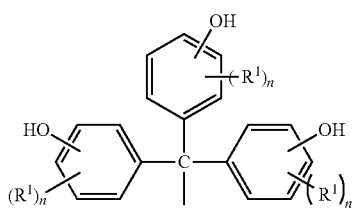

(1)

wherein $R^1$ is any of an aliphatic hydrocarbon group, an alkoxy group, a halogen atom, an aryl group and an aralkyl group, and n is 0 or an integer of 1 to 4.

In the structural formula (1), $R^1$ is any of an aliphatic hydrocarbon group, an alkoxy group, an aryl group, an aralkyl group and a halogen atom, and n is 0 or an integer of 1 to 4. Specific examples include aliphatic hydrocarbon groups such as methyl group, ethyl group, vinyl group, propyl group, butyl group, pentyl group, hexyl group, cyclohexyl group, heptyl group, octyl group and nonyl group; alkoxy groups such as methoxy group, ethoxy group, propyloxy group and butoxy group; halogen atoms such as fluorine atom, chlorine atom and bromine atom; aryl groups such as phenyl group, naphthyl group, anthryl group, and those groups resulting from the substitution of the above aryl groups, on their aromatic nuclei, with substituents such as the aliphatic hydrocarbon groups, alkoxy groups and halogen atoms mentioned above; and aralkyl groups such as phenylmethyl group, phenylethyl group, naphthylmethyl group, naphthylethyl group, and those groups resulting from the substitution of the above aralkyl groups, on their aromatic nuclei, with substituents such as the aliphatic hydrocarbon groups, alkoxy groups and halogen atoms mentioned above. Of the structural moieties represented by the structural formula (1), the tris(hydroxyphenyl)methine group in which n is 0 at each occurrence is preferable because the novolak resin that is obtained attains excellent properties such as heat resistance, alkali developability, photosensitivity and resolution.

The hydroxyl groups in the structural formula (1) may be substituted at any positions without limitation, that is, may be bonded to the ortho position, the meta position or the para position relative to the methine carbon. In particular, the hydroxyl groups are preferably bonded to the para position relative to the methine carbon in view of the fact that the novolak resin that is obtained attains excellent properties such as heat resistance, alkali developability, photosensitivity and resolution.

The compound (A) having a tris(hydroxyaryl)methine group may be any compound as long as having a tris (hydroxyaryl)methine group in the molecular structure. Other aspects such as specific structure are not particularly limited. The novolak resin of the present invention may involve a single, or two or more kinds of the compounds (A) having a tris(hydroxyaryl)methine group. Specific examples of the compounds (A) having a tris(hydroxyaryl)methine group include compounds represented by the following structural formula (2):

[Chem. 2]

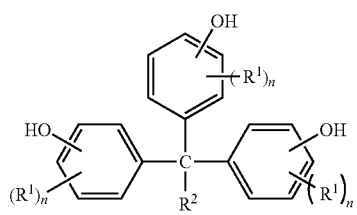

(2)

wherein $R^1$ is any of an aliphatic hydrocarbon group, an alkoxy group, an aryl group, an aralkyl group and a halogen atom, n is 0 or an integer of 1 to 4, and $R^2$ is a hydrocarbon group or is a structural moiety including a hydrocarbon group and one or more substituents on the hydrocarbon group which are selected from alkoxy groups, halogen atoms and hydroxyl groups.

In the structural formula (2), $R^1$ is defined the same as $R^1$ in the structural formula (1).

In the structural formula (2), $R^2$ is a hydrocarbon group or is a structural moiety including a hydrocarbon group and one or more substituents on the hydrocarbon group which are selected from alkoxy groups, halogen atoms and hydroxyl groups. Examples of the hydrocarbon groups include aliphatic hydrocarbon groups such as methyl group, ethyl group, vinyl group, propyl group, butyl group, pentyl group, hexyl group, cyclohexyl group, heptyl group, octyl group and nonyl group; aryl groups such as phenyl group, naphthyl group and anthryl group; and aralkyl groups such as phenylmethyl group, phenylethyl group, naphthylmethyl group and naphthylethyl group. Examples of the alkoxy groups include methoxy group, ethoxy group, propyloxy group and butoxy group. Examples of the halogen atoms include fluorine atom, chlorine atom and bromine atom. In particular, $R^2$ is preferably a hydrocarbon group or a structural moiety including a hydrocarbon group and one or more hydroxyl groups on the hydrocarbon group, and more preferably an aliphatic hydrocarbon group, in view of the fact that the novolak resin that is obtained attains excellent properties such as heat resistance, alkali developability, photosensitivity and resolution.

The compound (A) having a tris(hydroxyaryl)methine group may be obtained by, for example, reacting a hydroxyarene compound (a1) corresponding to a hydroxyaryl group, with a ketone compound (a2) having a hydroxyaryl group in the presence of an acid catalyst.

Specific examples of the hydroxyarene compounds (a1) and the ketone compounds (a2) having a hydroxyaryl group will be described. Where, for example, the compound (A) having a tris(hydroxyaryl)methine group is one represented by the structural formula (2), the hydroxyarene compound (a1) may be a compound represented by the structural formula (3) below, and the ketone compound (a2) having a hydroxyaryl group may be a compound represented by the structural formula (4) below:

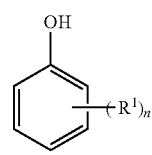

(3)

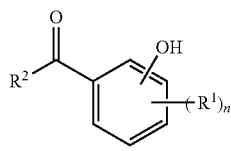

(4)

$R^1$ is any of an aliphatic hydrocarbon group, an alkoxy group, an aryl group, an aralkyl group and a halogen atom, n is 0 or an integer of 1 to 4, and $R^2$ is a hydrocarbon group or is a structural moiety including a hydrocarbon group and one or more substituents on the hydrocarbon group which are selected from alkoxy groups, halogen atoms and hydroxyl groups.

The aldehyde compound (B) may be any compound which can undergo condensation reaction with the compound (A) having a tris(hydroxyaryl)methine group to form a novolak resin structure. Examples thereof include formaldehyde, trioxane, acetaldehyde, propionaldehyde, tetraoxymethylene, polyoxymethylene, chloral, hexamethylenetetramine, furfural, glyoxal, n-butyraldehyde, caproaldehyde, allylaldehyde, benzaldehyde, phenylacetaldehyde, o-tolualdehyde, salicylaldehyde, crotonaldehyde and acrolein. These may be used singly, or two or more may be used in combination. In particular, it is preferable to use formaldehyde, which has high reactivity with the compound (A) having a tris(hydroxyaryl)methine group. Formaldehyde may be used as formalin that is an aqueous solution, or may be used as solid paraformaldehyde. When formaldehyde is used in combination with an additional aldehyde compound, it is preferable to use the additional aldehyde compound in a ratio of 0.05 to 1 mol per mol of formaldehyde.

The novolak resin of the present invention is one obtained from the compound (A) having a tris(hydroxyaryl)methine group and the aldehyde compound (B) as essential reaction ingredients. The compound (A) may be used in combination with an additional phenolic hydroxyl-containing compound (A'). Examples of the additional phenolic hydroxyl-containing compounds (A') include phenol; alkylphenols such as cresol, xylenol, ethylphenol, propylphenol, isopropylphenol, butylphenol, t-butylphenol, pentylphenol, octylphenol, nonylphenol and cumylphenol; halogenated phenols such as fluorophenol, chlorophenol, bromophenol and iodophenol; arylphenols such as phenylphenol; functional group-containing phenols such as aminophenol and nitrophenol; condensed polycyclic compounds such as naphthol and anthracenol; and polyhydroxy compounds such as dihydroxybenzene, dihydroxynaphthalene, biphenol and bisphenol. These may be used singly, or two or more may be used in combination.

Where the additional phenolic hydroxyl-containing compound (A') is used, the compound (A) having a tris(hydroxyaryl)methine group preferably represents not less than 50 mol %, more preferably not less than 80 mol %, and particularly preferably not less than 90 mol % of the total of the compound (A) having a tris(hydroxyaryl)methine group and the additional phenolic hydroxyl-containing compound (A'). This configuration ensures that the novolak resin of the present invention sufficiently exhibits its excellent properties such as heat resistance, alkali developability, photosensitivity and resolution.

The novolak resin of the invention may be produced by any method without limitation. The novolak resin may be produced using the compound (A) having a tris(hydroxyaryl)methine group and the aldehyde compound (B) as essential reaction ingredients, by a method adopted for the production of general phenol novolak resins. Specifically, for example, a method may be adopted in which the compound (A) having a tris(hydroxyaryl)methine group, the aldehyde compound (B) and optionally the additional phenolic hydroxyl-containing compound (A') are reacted in the presence of an acid catalyst at a temperature in the range of about 60 to 140° C.

Examples of the acid catalysts include acetic acid, oxalic acid, sulfuric acid, hydrochloric acid, phenolsulfonic acid, paratoluenesulfonic acid, zinc acetate and manganese acetate. The acid catalysts may be used singly, or two or more may be used in combination. In particular, sulfuric acid and paratoluenesulfonic acid are preferable due to their high catalytic activity.

The compound (A) having a tris(hydroxyaryl)methine group, the aldehyde compound (B) and optionally the additional phenolic hydroxyl-containing compound (A') are preferably reacted with such proportions that the number of moles of the aldehyde compound (B) is in the range of 0.5 to 1.2, and more preferably in the range of 0.6 to 0.9 per mol of the total of the compound (A) having a tris(hydroxyaryl) methine group and the additional phenolic hydroxyl-containing compound (A'). This configuration ensures that excessive polymerization will be prevented and the novolak resin will attain a molecular weight suited for use as, in particular, resists.

Where necessary, the reaction may be performed in an organic solvent. Examples of the organic solvents include monoalcohols such as methanol, ethanol, propanol and butanol; polyols such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol and glycerin; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether and ethylene glycol monophenyl ether; cyclic ethers such as 1,3-dioxane, 1,4-dioxane and tetrahydrofuran; glycol esters such as ethylene glycol acetate; and ketones such as acetone, methyl ethyl ketone and methyl isobutyl ketone. The solvents may be used singly, or two or more may be used as a mixed solvent.

Where necessary, the reaction may be followed by post treatments such as a step in which undesired components such as the unreacted ingredients and the solvent are removed by distillation, and a purification step in which the product is water washed or reprecipitated.

To ensure that the novolak resin of the invention will attain excellent properties such as heat resistance, alkali developability, photosensitivity and resolution and will be suitably used for resist materials, the weight average molecular weight (Mw) of the resin is preferably in the range of 5,000 to 30,000, and more preferably in the range of 10,000 to 30,000. The polydispersity (Mw/Mn) of the novolak resin is preferably in the range of 3 to 20, and more preferably in the range of 5 to 15.

The weight average molecular weight (Mw) and the polydispersity (Mw/Mn) in the present invention are values measured by GPC under the following conditions.

[GPC Measurement Conditions]

Measurement apparatus: "HLC-8220 GPC" manufactured by TOSOH CORPORATION

Columns: "Shodex KF802" (8.0 mmϕ×300 mm) manufactured by Showa Denko K.K.+"Shodex KF802" (8.0 mmφ×300 mm) manufactured by Showa Denko K.K.+"Shodex KF803" (8.0 mmφ×300 mm) manufactured by Showa Denko K.K.+"Shodex KF804" (8.0 mmφ×300 mm) manufactured by Showa Denko K.K.

Column temperature: 40° C.
    Detector: RI (differential refractometer)
    Data processing: "GPC-8020 model II version 4.30" manufactured by TOSOH CORPORATION
    Developing solvent: tetrahydrofuran
    Flow rate: 1.0 mL/min
    Sample: 0.5 mass %, in terms of resin solid, tetrahydrofuran solution filtered through microfilter (100 μl)
    Standard samples: the following monodisperse polystyrenes
        (Standard samples: monodisperse polystyrenes)
        "A-500" manufactured by TOSOH CORPORATION
        "A-2500" manufactured by TOSOH CORPORATION
        "A-5000" manufactured by TOSOH CORPORATION
        "F-1" manufactured by TOSOH CORPORATION
        "F-2" manufactured by TOSOH CORPORATION
        "F-4" manufactured by TOSOH CORPORATION
        "F-10" manufactured by TOSOH CORPORATION
        "F-20" manufactured by TOSOH CORPORATION The novolak resin of the invention discussed above is characterized in that it has very high heat resistance. Thus, the resin may be suitably used in applications including photoresists, various electric or electronic components such as liquid crystal orientation films and printed circuit boards, adhesives and paints. Further, the novolak resin of the invention also has excellent alkali solubility and photosensitivity, and is therefore particularly suited for resist applications and may be used in common interlayer insulating films and various resist members such as lower resist films and permanent resist films.

A photosensitive composition of the present invention includes the novolak resin of the invention and a photosensitizer as essential components. The photosensitive composition of the invention may include an additional resin (C) other than the novolak resin of the invention. The additional resin (C) may be any resin which is soluble in an alkali developing solution or can be dissolved into an alkali developing solution when used in combination with an additive such as an acid generator.

Examples of the additional resins (C) include additional phenol resins (C-1) other than the novolak resins of the invention, homopolymers and copolymers (C-2) of hydroxyl-containing styrene compounds such as p-hydroxystyrene and p-(1,1,1,3,3,3-hexafluoro-2-hydroxypropyl)styrene, modified products (C-3) obtained by modifying the hydroxyl groups in (C-1) or (C-2) with acid-decomposable groups such as t-butoxycarbonyl group and benzyloxycarbonyl group, (meth)acrylic acid homopolymers and copolymers (C-4), and alternating copolymers (C-5) formed between an alicyclic polymerizable monomer such as a norbornene compound or a tetracyclododecene compound, and maleic anhydride or maleimide.

Examples of the additional phenol resins (C-1) include phenol novolak resins, cresol novolak resins, naphthol novolak resins, aromatic hydrocarbon formaldehyde resin-modified phenol resins, dicyclopentadiene phenol-added resins, phenol aralkyl resins (xylok resins), naphthol aralkyl resins, trimethylolmethane resins, tetraphenylolethane resins, biphenyl-modified phenol resins (polyphenol compounds in which phenol nuclei are linked to one another each via two methylene groups), biphenyl-modified naphthol resins (polynaphthol compounds in which two phenol nuclei are linked to each naphthol moiety via a methylene group), aminotriazine-modified phenol resins (polyphenol compounds in which phenol nuclei are linked to one another via melamine, benzoguanamine or the like) and alkoxy group-containing aromatic ring-modified novolak resins (polyphenol compounds in which phenol nuclei and alkoxy group-containing aromatic rings are linked via formaldehyde).

Of the additional phenol resins (C-1), cresol novolak resins and co-condensed novolak resins formed between cresol and other phenolic compound are preferable because the photosensitive resin composition that is obtained exhibits high sensitivity and excellent heat resistance. Specifically, the cresol novolak resins and the co-condensed novolak resins formed between cresol and other phenolic compound are novolak resins that are obtained using at least one cresol selected from the group consisting of o-cresol, m-cresol and p-cresol, and an aldehyde compound as essential ingredients, optionally together with an additional phenolic compound.

Examples of the above additional phenolic compounds other than cresol include phenol; xylenols such as 2,3-xylenol, 2,4-xylenol, 2,5-xylenol, 2,6-xylenol, 3,4-xylenol and 3,5-xylenol; ethylphenols such as o-ethylphenol, m-ethylphenol and p-ethylphenol; isopropylphenol, butylphenols such as butylphenol and p-t-butylphenol; alkylphenols such as p-pentylphenol, p-octylphenol, p-nonylphenol and p-cumylphenol; halogenated phenols such as fluorophenol, chlorophenol, bromophenol and iodophenol; monosubstituted phenols such as p-phenylphenol, aminophenol, nitrophenol, dinitrophenol and trinitrophenol; condensed polycyclic phenols such as 1-naphthol and 2-naphthol; and polyhydric phenols such as resorcin, alkylresorcin, pyrogallol, catechol, alkylcatechol, hydroquinone, alkylhydroquinone, phloroglucinol, bisphenol A, bisphenol F, bisphenol S and dihydroxynaphthalene. The additional phenolic compounds may be used singly, or two or more may be used in combination. When the additional phenolic compound is used, the amount in which it is used is preferably such that the number of moles of the additional phenolic compound is in the range of 0.05 to 1 mol per mol of the total of the cresol ingredients.

Examples of the aldehyde compounds include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde and salicylaldehyde. The aldehyde compounds may be used singly, or two or more may be used in combination. In particular, formaldehyde is preferable because of its high reactivity, and use may be made of a combination of formaldehyde and an additional aldehyde compound. When formaldehyde and an additional aldehyde compound are used in combination, the amount of the additional aldehyde compound is preferably in the range of 0.05 to 1 mol per mol of formaldehyde.

To ensure that the photosensitive resin composition that is obtained will exhibit excellent sensitivity and heat resistance, the phenolic compound and the aldehyde compound used in the production of the novolak resin are preferably reacted in a ratio of 0.3 to 1.6 mol, and more preferably 0.5 to 1.3 mol for the aldehyde compound per mol of the phenolic compound.

The phenolic compound and the aldehyde compound may be reacted in the presence of an acid catalyst at a temperature of 60 to 140° C., the reaction being followed by the removal of water and residual monomers under reduced pressure.

Examples of the acid catalysts used here include oxalic acid, sulfuric acid, hydrochloric acid, phenolsulfonic acid, paratoluenesulfonic acid, zinc acetate and manganese acetate. The acid catalysts may be used singly, or two or more may be used in combination. In particular, oxalic acid is preferable due to its high catalytic activity.

Of the cresol novolak resins and the co-condensed novolak resins formed between cresol and other phenolic compound discussed above, preferred resins are cresol novolak resins involving metacresol alone, and cresol novolak resins involving a combination of metacresol and paracresol. In the latter resins, the reaction molar ratio of metacresol to paracresol [metacresol/paracresol] is preferably in the range of 10/0 to 2/8, and more preferably in the range of 7/3 to 2/8, in which case the photosensitive resin composition that is obtained attains an excellent balance between sensitivity and heat resistance.

Where the additional resin (C) is used, the proportions of the novolak resin of the invention and the additional resin (C) may be controlled appropriately in accordance with the desired use application. Because the novolak resin of the invention has outstanding heat resistance and is also excellent in alkali solubility and photosensitivity, the photosensitive composition based on this component is best suited in, for example, resist applications. Here, the proportion of the novolak resin of the invention is preferably not less than 60 mass %, and more preferably not less than 80 mass % of the total of the resin components.

The heat resistance of the novolak resin of the invention is of unprecedentedly high level. Thus, the photosensitive composition may be based on the additional resin (C) and contain a portion of the novolak resin of the invention in order to attain an enhancement in heat resistance. In this case, the proportions of the novolak resin of the invention and the additional resin (C) are preferably such that the amount of the novolak resin of the invention is in the range of 3 to 80 parts by mass per 100 parts by mass of the additional resin (C).

Examples of the photosensitizers include compounds having a quinonediazide group. Specific examples of the compounds having a quinonediazide group include complete ester compounds, partial ester compounds, amidated compounds and partially amidated compounds each formed between an aromatic (poly)hydroxy compound and a sulfonic acid having a quinonediazide group such as naphthoquinone-1,2-diazido-5-sulfonic acid, naphthoquinone-1,2-diazido-4-sulfonic acid or orthoanthraquinonediazidosulfonic acid.

Examples of the aromatic (poly)hydroxy compounds used here include polyhydroxybenzophenone compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone and 2,3,3',4,4',5'-hexahydroxybenzophenone; bis[(poly)hydroxyphenyl]alkane compounds such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol, and 3,3'-dimethyl-{1-[4-[2-(3-methyl-4-hydroxyphenyl)-2-propyl]phenyl]ethylidene}bisphenol;

tris(hydroxyphenyl)methane compounds and methyl-substituted products thereof, such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane; and bis(cyclohexylhydroxyphenyl)(hydroxyphenyl)methane compounds and methyl-substituted products thereof, such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, and bis(5-cyclohexyl-2-hydroxy-4-methylphenyl)-4-hydroxyphenylmethane. The photosensitizers may be used singly, or two or more may be used in combination.

To ensure that the photosensitive composition of the invention will exhibit excellent photosensitivity, the photosensitizer is preferably added to the photosensitive composition in a ratio of 5 to 50 parts by mass per 100 parts by mass of the total of the resin solids in the photosensitive composition.

For purposes such as to enhance film-forming properties and pattern adhesion in resist applications, and to reduce the occurrence of development defects, the photosensitive composition of the invention may contain a surfactant. Examples of the surfactants used here include nonionic surfactants including polyoxyethylene alkyl ether compounds such as polyoxyethylene lauryl ether, polyoxyethylene stearyl ether, polyoxyethylene cetyl ether and polyoxyethylene oleyl ether, polyoxyethylene alkylallyl ether compounds such as polyoxyethylene octylphenol ether and polyoxyethylene nonylphenol ether, sorbitan fatty acid ester compounds such as polyoxyethylene polyoxypropylene block copolymers, sorbitan monolaurate, sorbitan monopalmitate, sorbitan monostearate, sorbitan monooleate, sorbitan trioleate and sorbitan tristearate, and polyoxyethylene sorbitan fatty acid ester compounds such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants having a fluorine atom in the molecular structure, such as copolymers of a polymerizable monomer having a fluoroaliphatic group with [poly(oxyalkylene)] (meth)acrylate; and silicone surfactants having a silicone structural moiety in the molecular structure. The surfactants may be used singly, or two or more may be used in combination.

The surfactant is preferably added in the range of 0.001 to 2 parts by mass per 100 parts by mass of the total of the resin solids in the photosensitive composition of the invention.

Where the photosensitive composition of the invention is used for photoresist applications, such a resist composition may be prepared by mixing the novolak resin of the invention, the photosensitizer and optionally the additional resin (C), the surfactant, and additives such as dyes, fillers, crosslinking agents and dissolution promotors, and dissolving the mixture into an organic solvent. The composition thus obtained may be used directly as a positive resist solution. Alternatively, the resist composition may be used as a positive resist film which is formed by the application of the composition into a film followed by the removal of the solvent. The support film for the resist film may be a film of a synthetic resin such as polyethylene, polypropylene, polycarbonate or polyethylene terephthalate. The support film may be a single-layer film or a stack of a plurality of films. The surface of the support film may be corona treated or coated with a releasing agent.

Examples of the organic solvents for use in the photosensitive composition of the invention include, although not particularly limited to, alkylene glycol monoalkyl ethers such as ethylene glycol monomethyl ether, ethylene glycol monoethyl ether, ethylene glycol monopropyl ether, ethylene glycol monobutyl ether and propylene glycol monomethyl ether; dialkylene glycol dialkyl ethers such as diethylene glycol dimethyl ether, diethylene glycol diethyl ether, diethylene glycol dipropyl ether and diethylene glycol dibutyl ether; alkylene glycol alkyl ether acetates such as ethylene glycol monomethyl ether acetate, ethylene glycol monoethyl ether acetate and propylene glycol monomethyl ether acetate; ketone compounds such as acetone, methyl ethyl ketone, cyclohexanone and methyl amyl ketone; cyclic ethers such as dioxane; and ester compounds such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, ethyl acetoacetate and ethyl lactate. These may be used singly, or two or more may be used in combination.

The photosensitive composition of the invention may be produced by combining the components described hereinabove and mixing the resultant mixture with use of a device such as a stirrer. Where a filler or a pigment is used, the photosensitive composition may be produced by dispersing or mixing the components with use of a dispersing device such as a dissolver, a homogenizer or a three-roll mill.

In a photolithographic method using the photosensitive composition of the invention, for example, the photosensitive composition is applied onto a silicon substrate photolithography workpiece, and the film is prebaked at a temperature of 60 to 150° C. Here, the composition may be applied by any method such as spin coating, roll coating, flow coating, dip coating, spray coating or doctor blade coating. Next, a resist pattern is formed. Because the photosensitive composition of the invention is of positive type, the composition is irradiated through a predetermined mask which exposes the desired resist pattern, and the irradiated portions are dissolved with an alkali developing solution, thus leaving the resist pattern. The photosensitive composition of the invention performs well in terms of alkali solubility of the irradiated portions, and alkali dissolution resistance of the non-irradiated portions, and thus can form a resist pattern with high resolution.

A curable composition of the invention includes the novolak resin of the invention and a curing agent as essential components. The curable composition of the invention may include an additional resin (D) other than the novolak resin of the invention. Examples of the additional resins (D) used here include various novolak resins, addition polymerized resins formed between an alicyclic diene compound such as dicyclopentadiene and a phenol compound, modified novolak resins formed between a phenolic hydroxyl-containing compound and an alkoxy-containing aromatic compound, phenol aralkyl resins (xylok resins), naphthol aralkyl resins, trimethylolmethane resins, tetraphenylolethane resins, biphenyl-modified phenol resins, biphenyl-modified naphthol resins, aminotriazine-modified phenol resins and various vinyl polymers.

Specific examples of the various novolak resins mentioned above include polymers obtained by the reaction, catalyzed by an acid catalyst, of an aldehyde compound with a phenolic hydroxyl-containing compound, for example, phenol, an alkylphenol such as cresol or xylenol, phenylphenol, resorcinol, biphenyl, a bisphenol such as bisphenol A or bisphenol F, naphthol, or dihydroxynaphthalene.

Examples of the various vinyl polymers mentioned above include homopolymers of vinyl compounds such as polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene and poly(meth)acrylate, and copolymers of these polymers.

Where the additional resin is used, the proportions of the novolak resin of the invention and the additional resin (D) may be determined appropriately in accordance with use application. To ensure that the high heat resistance, which is an advantageous effect of the present invention, will be exhibited more significantly, the proportion of the additional resin (D) is preferably 0.5 to 100 parts by mass per 100 parts by mass of the novolak resin of the invention.

Examples of the curing agents used in the invention include melamine compounds, guanamine compounds, glycoluril compounds, urea compounds, resol resins, epoxy compounds, isocyanate compounds, azide compounds, compounds containing a double bond such as an alkenyl ether group, acid anhydrides and oxazoline compounds wherein these compounds may be substituted with at least one group selected from methylol groups, alkoxymethyl groups and acyloxymethyl groups.

Examples of the melamine compounds include hexamethylolmelamine, hexamethoxymethylmelamine, compounds resulting from the methoxymethylation of one to six methylol groups in hexamethylolmelamine, hexamethoxyethylmelamine, hexaacyloxymethylmelamine, and compounds resulting from the acyloxymethylation of one to six methylol groups in hexamethylolmelamine.

Examples of the guanamine compounds include tetramethylolguanamine, tetramethoxymethylguanamine, tetramethoxymethylbenzoguanamine, compounds resulting from the methoxymethylation of one to four methylol groups in tetramethylolguanamine, tetramethoxyethylguanamine, tetraacyloxyguanamine, and compounds resulting from the acyloxymethylation of one to four methylol groups in tetramethylolguanamine.

Examples of the glycoluril compounds include 1,3,4,6-tetrakis(methoxymethyl)glycoluril, 1,3,4,6-tetrakis(butoxymethyl)glycoluril, and 1,3,4,6-tetrakis(hydroxymethyl)glycoluril.

Examples of the urea compounds include 1,3-bis(hydroxymethyl)urea, 1,1,3,3-tetrakis(butoxymethyl)urea, and 1,1,3,3-tetrakis(methoxymethyl)urea.

Examples of the resol resins include polymers obtained by the reaction, catalyzed by an alkaline catalyst, of an aldehyde compound with a phenolic hydroxyl-containing compound, for example, phenol, an alkylphenol such as cresol or xylenol, phenylphenol, resorcinol, biphenyl, a bisphenol such as bisphenol A or bisphenol F, naphthol, or dihydroxynaphthalene.

Examples of the epoxy compounds include diglycidyloxynaphthalene, phenol novolak epoxy resins, cresol novolak epoxy resins, naphthol novolak epoxy resins, naphthol-phenol co-condensed novolak epoxy resins, naphthol-cresol co-condensed novolac epoxy resins, phenol aralkyl epoxy resins, naphthol aralkyl epoxy resins, 1,1-bis(2,7-diglycidyloxy-1-naphthyl)alkanes, naphthylene ether epoxy resins, triphenylmethane epoxy resins, dicyclopentadiene-phenol addition reaction type epoxy resins, phosphorus atom-containing epoxy resins, and polyglycidyl ethers of co-condensates of a phenolic hydroxyl-containing compound and an alkoxy-containing aromatic compound.

Examples of the isocyanate compounds include tolylene diisocyanate, diphenylmethane diisocyanate, hexamethylene diisocyanate and cyclohexane diisocyanate.

Examples of the azide compounds include 1,1'-biphenyl-4,4'-bisazide, 4,4'-methylidenebisazide and 4,4'-oxybisazide.

Examples of the compounds containing a double bond such as an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether and trimethylolpropane trivinyl ether.

Examples of the acid anhydrides include aromatic acid anhydrides such as phthalic anhydride, trimellitic anhydride, pyromellitic anhydride, 3,3',4,4'-benzophenonetetracarboxylic dianhydride, biphenyltetracarboxylic dianhydride, 4,4'-(isopropylidene)diphthalic anhydride and 4,4'-(hexafluoroisopropylidene)diphthalic anhydride; and alicyclic carboxylic acid anhydrides such as tetrahydrophthalic anhydride, methyltetrahydrophthalic anhydride, hexahydrophthalic anhydride, methylhexahydrophthalic anhydride, endomethylenetetrahydrophthalic anhydride, dodecenylsuccinic anhydride and trialkyltetrahydrophthalic anhydride.

Of the compounds mentioned above, glycoluril compounds, urea compounds and resol resins are preferable, and glycoluril compounds are particularly preferable for the reason that the curable composition that is obtained exhibits excellent curability and gives cured products with high heat resistance.

To ensure excellent curability of the composition, the proportion of the curing agent in the curable composition of the invention is preferably 0.5 to 50 parts by mass per 100 parts by mass of the total of the novolak resin of the invention and the additional resin (D).

Where the curable composition of the invention is used in lower resist film (BARC film) applications, such a lower resist film-forming composition may be prepared by mixing the novolak resin of the invention, the curing agent and optionally the additional resin (D), the surfactant, and additives such as dyes, fillers, crosslinking agents and dissolution promotors, and dissolving the mixture into an organic solvent.

Examples of the organic solvents for use in the lower resist film-forming composition include, although not particularly limited to, alkylene glycol monoalkyl ethers such as ethylene glycol monomethyl ether, ethylene glycol monoethyl ether, ethylene glycol monopropyl ether, ethylene glycol monobutyl ether and propylene glycol monomethyl ether; dialkylene glycol dialkyl ethers such as diethylene glycol dimethyl ether, diethylene glycol diethyl ether, diethylene glycol dipropyl ether and diethylene glycol dibutyl ether; alkylene glycol alkyl ether acetates such as ethylene glycol monomethyl ether acetate, ethylene glycol monoethyl ether acetate and propylene glycol monomethyl ether acetate; ketone compounds such as acetone, methyl ethyl ketone, cyclohexanone and methyl amyl ketone; cyclic ethers such as dioxane; and ester compounds such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, ethyl acetoacetate and ethyl lactate. These may be used singly, or two or more may be used in combination.

The lower resist film-forming composition may be produced by combining the components described hereinabove and mixing the resultant mixture with use of a device such as a stirrer. Where a filler or a pigment is used, the lower resist film-forming composition may be produced by dispersing or mixing the components with use of a dispersing device such as a dissolver, a homogenizer or a three-roll mill.

For example, a lower resist film may be produced from the lower resist film-forming composition in the following manner. The lower resist film-forming composition is applied onto a photolithography workpiece such as a silicon substrate, and the film is dried at a temperature of 100 to 200° C. and is thereafter further cured by heating at a temperature of 250 to 400° C. to form a lower resist film. Next, the usual photolithography process is performed on the lower film to form a resist pattern, and the film is treated by dry etching using a halogen plasma gas or the like. A multilayer resist pattern can be thus formed.

Where the curable composition of the invention is used in permanent resist film applications, such a permanent resist film-forming composition may be prepared by mixing the novolak resin of the invention, the curing agent and optionally the additional resin (D), the surfactant, and additives such as dyes, fillers, crosslinking agents and dissolution promotors, and dissolving the mixture into an organic solvent. The organic solvent used here may be any of the organic solvents used for the lower resist film-forming composition.

In a photolithographic method using the permanent resist film-forming composition, for example, the resin components and additive components are dissolved and dispersed in an organic solvent, the solution or dispersion is applied onto a silicon substrate photolithography workpiece, and the film is prebaked at a temperature of 60 to 150° C. Here, the application may be performed by any method such as spin coating, roll coating, flow coating, dip coating, spray coating or doctor blade coating. Next, a resist pattern is formed. If the permanent resist film-forming composition is of positive type, the composition is irradiated through a predetermined mask which exposes the desired resist pattern, and the irradiated portions are dissolved with an alkali developing solution, thus leaving the resist pattern.

Permanent films formed from the permanent resist film-forming composition may be suitably used for, for example, semiconductor device-related materials such as solder resists, packaging materials, underfill materials, adhesive layers for packages such as circuit elements, and adhesive layers for the bonding between integrated circuit elements and circuit boards, and materials associated with thin displays represented by LCD and OELD such as thin film transistor protective films, liquid crystal color filter protective films, black matrixes and spacers.

EXAMPLES

The present invention will be described in greater detail by presenting specific examples hereinbelow. The number average molecular weight (Mn), weight average molecular weight (Mw) and polydispersity (Mw/Mn) of resins synthesized were measured under the following GPC conditions.
[GPC Measurement Conditions]
Measurement apparatus: "HLC-8220 GPC" manufactured by TOSOH CORPORATION
Columns: "Shodex KF802" (8.0 mmϕ×300 mm) manufactured by Showa Denko K.K.+"Shodex KF802" (8.0 mmϕ×300 mm) manufactured by Showa Denko K.K.+"Shodex KF803" (8.0 mmϕ×300 mm) manufactured by Showa Denko K.K.+"Shodex KF804" (8.0 mmϕ×300 mm) manufactured by Showa Denko K.K.
Column temperature: 40° C.
Detector: RI (differential refractometer)
Data processing: "GPC-8020 model II version 4.30" manufactured by TOSOH CORPORATION
Developing solvent: tetrahydrofuran
Flow rate: 1.0 mL/min
Sample: 0.5 mass %, in terms of resin solid, tetrahydrofuran solution filtered through microfilter
Injection volume: 0.1 mL
Standard samples: the following monodisperse polystyrenes
(Standard samples: monodisperse polystyrenes)
"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION Production Example 1 Production of Novolak Resin (1)

A 3000 ml four-necked flask equipped with a cooling tube was loaded with 60 g of 1,1,1-tris(4-hydroxyphenyl)ethane represented by the structural formula (2-1) below. The compound was dissolved with 100 ml of 1-butanol. While performing cooling in an ice bath, 3 ml of sulfuric acid was added and further 6 g of 92% paraformaldehyde was added. The temperature was raised to 90° C. in an oil bath. The reaction was performed at 90° C. for 10 hours while performing stirring. Water was added to the reaction mixture to reprecipitate the product. A crude product was thus obtained. The crude product was redissolved into acetone, and was further reprecipitated using water. The precipitate was recovered by filtration and vacuum dried to give 60 g of a novolak resin (1) as an ocher powder. The GPC chart of the novolak resin (1) is shown in FIG. 1. The novolak resin (1) had a number average molecular weight (Mn) of 2,021, a weight average molecular weight (Mw) of 17,890, and a polydispersity (Mw/Mn) of 8.85.

[Chem. 3]

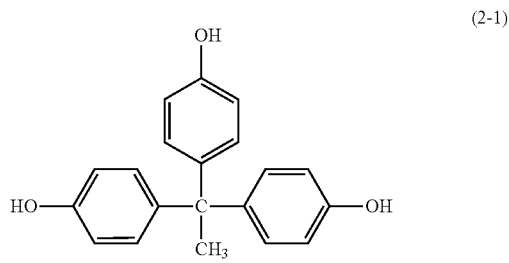

(2-1)

Comparative Production Example 1 Production of Novolak Resin (1')

A 300 ml four-necked flask equipped with a cooling tube was loaded with 648 g of m-cresol, 432 g of p-cresol, 2.5 g of oxalic acid and 492 g of 42% formaldehyde. The temperature was raised to 100° C., and the reaction was carried out. The temperature was increased to 200° C. at atmospheric pressure, and the system was dehydrated and distilled. Further, vacuum distillation was performed at 230° C. for 6 hours to give 736 g of a novolak resin (1') as a light yellow solid. The novolak resin (1') had a number average molecular weight (Mn) of 1,450, a weight average molecular weight (Mw) of 10,316, and a polydispersity (Mw/Mn) of 7.12.

Example 2 and Comparative Example 1

The novolak resins obtained in Example 1 and Comparative Production Example 1 were evaluated in the following manner. The results are described in Table 1.
Production of Photosensitive Compositions
28 Parts by mass of the novolak resin was dissolved into 60 parts by mass of propylene glycol monomethyl ether acetate. 12 Parts by mass of a photosensitizer was added to the solution and was dissolved therein. The resultant solution was filtered through a 0.2 μm membrane filter. A photosensitive composition was thus obtained.

The photosensitizer used was "P-200" manufactured by Toyo Gosei Co., Ltd. (a condensate of 1 mol of 4,4'-[1-[4-[1-(4-hydroxyphenyl)-1-methylethyl]phenyl]ethylidene] bisphenol and 2 mol of 1,2-naphthoquinone-2-diazido-5-sulfonyl chloride).
Production of Heat Resistance Test Compositions
28 Parts by mass of the novolak resin was dissolved into 60 parts by mass of propylene glycol monomethyl ether acetate. The solution was filtered through a 0.2 μm membrane filter. A heat resistance test composition was thus obtained.
Evaluation of Alkali Developability [ADR (Å/s)]
A 5 inch silicon wafer was spin coated with the photosensitive composition obtained above with a thickness of about 1 μm. The film was dried over a 110° C. hot plate for 60 seconds. Two such wafers were provided. One was an "unexposed sample". The other was exposed to 100 mJ/cm² ghi radiation with use of a ghi radiation lamp ("Multilight"

manufactured by USHIO INC.) and was heat treated at 140° C. for 60 seconds, thus giving an "exposed sample".

The "unexposed sample" and the "exposed sample" were both soaked in an alkali developing solution (a 2.38% aqueous tetramethylammonium hydroxide solution) for 60 seconds, and were dried over a 110° C. hot plate for 60 seconds. The difference in film thickness of the sample measured before and after the developer soaking was divided by 60, thereby evaluating alkali developability [ADR (Å/s)].

Evaluation of Photosensitivity

A 5 inch silicon wafer was spin coated with the photosensitive composition obtained above with a thickness of about 1 μm. The film was dried over a 110° C. hot plate for 60 seconds. A mask was brought into close contact with the wafer, the mask corresponding to a resist pattern having a line to space ratio of 1:1 and line widths of 1 to 10 μm with an increment of 1 μm. The film was then exposed to ghi radiation with use of a ghi radiation lamp ("Multilight" manufactured by USHIO INC.) and was heat treated at 140° C. for 60 seconds. Next, the film was soaked in an alkali developing solution (a 2.38% aqueous tetramethylammonium hydroxide solution) for 60 seconds, and was dried over a 110° C. hot plate for 60 seconds.

The ghi dose was increased from 80 mJ/cm$^2$ with an increment of 5 mJ/cm$^2$, and the exposure dose (Eop dose) up to which the composition faithfully reproduced a line width of 3 μm was determined.

Evaluation of Resolution

A 5 inch silicon wafer was spin coated with the photosensitive composition obtained above with a thickness of about 1 μm. The film was dried over a 110° C. hot plate for 60 seconds. A photomask was placed onto the wafer, and the film was irradiated with 200 mJ/cm$^2$ ghi radiation and was developed in the same manner as described in the evaluation of alkali developability. The condition of the pattern was examined with use of a laser microscope ("VK-X200" manufactured by KEYENCE CORPORATION). The resolution was evaluated as A when 5 μm resolution was achieved in an L/S=1/1 pattern, and as B when 5 μm resolution was not obtained in an L/S=1/1 pattern.

Evaluation of Heat Resistance

A 5 inch silicon wafer was spin coated with the heat resistance test composition obtained above with a thickness of about 1 μm. The film was dried over a 110° C. hot plate for 60 seconds. The resin was scraped off from the wafer and was analyzed to measure its glass transition temperature (Tg). The measurement of glass transition temperature (Tg) was performed using a differential scanning calorimeter (DSC) ("Q100" manufactured by TA Instruments) in a nitrogen atmosphere at temperatures ranging from 25 to 400° C. and at a heat-up rate of 10° C./min.

TABLE 1

| | | Ex. 2 | Comp. Ex. 1 |
|---|---|---|---|
| Novolak resin | | (1) | (1') |
| Alkali developability | "Unexposed sample" | 0 | 0 |
| [Å/s] | "Exposed sample" | 8700 | 80 |
| Photosensitivity [mJ/cm$^2$] | | 100 | >600 |
| Resolution | | A | B |
| Heat resistance [° C.] | | 353 | 84 |

Example 3 and Comparative Example 2

The novolak resins obtained in Example 1 and Comparative Production Example 1 were evaluated in the following manner. The results are described in Table 2.

Production of Curable Compositions

16 Parts by mass of the novolak resin and 4 parts by mass of a curing agent (1,3,4,6-tetrakis(methoxymethyl)glycoluril manufactured by Tokyo Chemical Industry Co., Ltd.) were dissolved into 30 parts by mass of propylene glycol monomethyl ether acetate. The solution was filtered through a 0.2 μm membrane filter. A curable composition was thus obtained.

Evaluation of Alkali Developability [ADR (Å/s)]

A 5 inch silicon wafer was spin coated with the curable composition obtained above with a thickness of about 1 μm. The film was dried over a 110° C. hot plate for 60 seconds. Two such wafers were provided. One was an "uncured sample". The other was heat treated at 230° C. for 60 seconds, thus giving a "cured sample".

The "uncured sample" and the "cured sample" were both soaked in an alkali developing solution (a 2.38% aqueous tetramethylammonium hydroxide solution) for 60 seconds, and were dried over a 110° C. hot plate for 60 seconds. The difference in film thickness of the sample measured before and after the developer soaking was divided by 60, thereby evaluating alkali developability [ADR (Å/s)].

Evaluation of Heat Resistance

A 5 inch silicon wafer was spin coated with the curable composition obtained above with a thickness of about 1 μm. The film was dried over a 110° C. hot plate for 60 seconds and was heat treated at 230° C. for 60 seconds. The resin was scraped off from the wafer and was analyzed to measure its glass transition temperature (Tg). The measurement of glass transition temperature (Tg) was performed using a differential scanning calorimeter (DSC) ("Q100" manufactured by TA Instruments) in a nitrogen atmosphere at temperatures ranging from 25 to 400° C. and at a heat-up rate of 10° C./min.

TABLE 2

| | | Ex. 3 | Comp. Ex. 2 |
|---|---|---|---|
| Novolak resin | | (1) | (1') |
| Alkali developability | "Uncured sample" | 6500 | 50 |
| [Å/s] | "Cured sample" | 0 | 0 |
| Heat resistance [° C.] | | 376 | 119 |

The invention claimed is:

1. A novolak resin obtained from a phenolic hydroxyl-containing compound containing a compound (A) having a tris(hydroxyaryl)methine group and formaldehyde (B) as essential reaction ingredients, wherein the compound (A) having a tris(hydroxyaryl) methine group is a compound represented by the following structural formula (2),

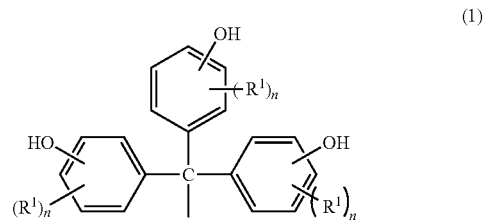

wherein R$^1$ is any of an aliphatic hydrocarbon group, an alkoxy group, an aryl group, an aralkyl group and a halogen atom, n is 0 or an integer of 1 to 4, and R$^2$ is a hydrocarbon group or a structural moiety including a hydrocarbon group and one or more substituents on the hydrocarbon group which are selected from alkoxy groups, halogen atoms and hydroxyl groups, wherein the compound (A) having a tris(hydroxyaryl) methine group represents not less than 90 mol % of the phenolic hydroxyl-containing compound, and wherein the novolak resin having a polydispersity (Mw/Mn) in the range of 3 to 20.

2. A curable composition comprising the novolak resin described in claim 1, and a curing agent.

3. A cured product of the curable composition described in claim 2.

4. A resist material comprising the curable composition described in claim 2.

5. The novolak resin according to claim 1, which has a weight average molecular weight (Mw) in the range of 5,000 to 30,000.

6. The photosensitive composition comprising the novolak resin described in claim 1, and a photosensitizer.

7. A resist material comprising the photosensitive composition described in claim 6.

8. The novolak resin according to claim 1, wherein $R^2$ is a hydrocarbon group or is a structural moiety including a hydrocarbon group and one or more hydroxyl groups on the hydrocarbon group.

9. A curable composition comprising the novolak resin described in claim 8, and a curing agent.

10. A cured product of the curable composition described in claim 9.

11. A resist material comprising the curable composition described in claim 9.

12. The novolak resin according to claim 8, which has a weight average molecular weight (Mw) in the range of 5,000 to 30,000.

13. The photosensitive composition comprising the novolak resin described in claim 8, and a photosensitizer.

14. A resist material comprising the photosensitive composition described in claim 13.

15. The novolak resin according to claim 1, wherein $R^2$ is an aliphatic hydrocarbon group.

16. A curable composition comprising the novolak resin described in claim 15, and a curing agent.

17. A cured product of the curable composition described in claim 16.

18. A resist material comprising the curable composition described in claim 16.

19. The novolak resin according to claim 15, which has a weight average molecular weight (Mw) in the range of 5,000 to 30,000.

20. The photosensitive composition comprising the novolak resin described in claim 15, and a photosensitizer.

* * * * *